US009171858B2

(12) United States Patent
Shum et al.

(10) Patent No.: US 9,171,858 B2
(45) Date of Patent: Oct. 27, 2015

(54) MULTI-LEVEL MEMORY CELLS AND METHODS FOR FORMING MULTI-LEVEL MEMORY CELLS

(71) Applicant: GLOBALFOUNDRIES Singapore Pte. Ltd.

(72) Inventors: Danny Pak-Chum Shum, Singapore (SG); Fook Hong Lee, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 27 days.

(21) Appl. No.: 14/143,118

(22) Filed: Dec. 30, 2013

(65) Prior Publication Data

US 2015/0187787 A1    Jul. 2, 2015

(51) Int. Cl.
| | |
|---|---|
| H01L 27/115 | (2006.01) |
| H01L 29/66 | (2006.01) |
| H01L 21/321 | (2006.01) |
| H01L 29/792 | (2006.01) |
| H01L 29/423 | (2006.01) |
| H01L 21/28 | (2006.01) |
| H01L 21/768 | (2006.01) |
| H01L 21/3205 | (2006.01) |

(52) U.S. Cl.
CPC .... *H01L 27/11568* (2013.01); *H01L 21/28282* (2013.01); *H01L 21/3212* (2013.01); *H01L 21/32055* (2013.01); *H01L 21/768* (2013.01); *H01L 27/115* (2013.01); *H01L 27/11524* (2013.01); *H01L 29/42344* (2013.01); *H01L 29/66833* (2013.01); *H01L 29/792* (2013.01)

(58) Field of Classification Search
CPC ................................................ H01L 27/11524
See application file for complete search history.

(56) References Cited

U.S. PATENT DOCUMENTS

| | | | |
|---|---|---|---|
| 6,962,851 B2 * | 11/2005 | Ding | 438/266 |
| 7,361,567 B2 | 4/2008 | Rao et al. | |
| 7,800,164 B2 | 9/2010 | Muralidhar et al. | |
| 7,871,886 B2 | 1/2011 | Hong et al. | |
| 7,932,189 B2 | 4/2011 | Merchant et al. | |
| 8,329,544 B2 | 12/2012 | Kang et al. | |
| 2009/0309149 A1* | 12/2009 | Nirschl et al. | 257/315 |
| 2014/0319596 A1* | 10/2014 | Min | 257/325 |

OTHER PUBLICATIONS

Chang, "SG-TFS: a Versatile Embedded Flash with Silicon Nanocrystals as the Storage Medium" Solid-State and Integrated-Circuit Technology, 9th International Conference on Oct. 20-23, 2008, pp. 943-946.
Atwood et al., "Intel StrataFlashTM Memory Technology Overview", Intel Technology Journal, Q4, 1997, pp. 1-8.

* cited by examiner

*Primary Examiner* — Thao X Le
*Assistant Examiner* — Xia L Cross
(74) *Attorney, Agent, or Firm* — Ingrassia Fisher & Lorenz, P.C.

(57) ABSTRACT

Integrated circuits with multi-level memory cells and methods for producing the same are provided. A method for producing an integrated circuit with a multi-level memory cell includes forming a gate insulator overlying a substrate. A select gate is formed overlying the gate insulator such that one multi-level memory cell includes one select gate. A thin film storage layer with nanocrystals is formed overlying the select gate and the substrate, and a left and right control gate are formed on opposite sides of the select gate such that the thin film storage layer is between the substrate and each of the control gates. A left implant and a right implant are formed in the substrate such that the select gate, the left control gate, and the right control gate are positioned between the left and right implants.

17 Claims, 5 Drawing Sheets

MULTI-LEVEL MEMORY CELLS AND METHODS FOR FORMING MULTI-LEVEL MEMORY CELLS

TECHNICAL FIELD

The technical field generally relates to multi-level memory cells, and more particularly relates to multi-level memory cells with thin film storage crystals (also known as silicon nanocrystals).

BACKGROUND

The semiconductor industry is continuously moving toward the fabrication of smaller and more complex microelectronic components with higher performance. Memory cells are an important component of many microelectronic components, and smaller memory cells that can store more information are desirable. The standard one bit memory cell can store one bit of data as either a logical "0" or a logical "1" state. A multi-level memory cell can store more than one bit of data. For example, a two bit memory cell can store 4 logical states of data ($2^2$) as either a "00", a "01", a "10", or a "11". A three bit memory cell can store eight bits of data ($2^3$), and so on. Multi-level memory cells frequently reduce manufacturing costs per bit of data stored, because the same production steps are used for multiple bits to achieve a higher density memory array for a given "footprint" or area. Multi-level memory cells also shrink the area required to store a bit of data, so smaller components are possible.

One type of memory cell is flash memory that is non-volatile and re-writable. Non-volatile memory retains stored information even when the memory cell is de-powered, and stored information can be changed when a memory cell is re-writable. Most multi-level memory cells in production today are non-volatile. Some memory cells for flash memory store information by either charging or draining an electrically isolated component, and the information is recalled by determining if the isolated component is charged or not. One type of memory cell used for flash memory is a thin film storage cell that uses discrete storage crystals, called silicon nanocrystals, to hold the charge. The storage crystals are relatively small, so thin film storage cells are useful for reducing the size of memory cells. However, the use of thin film storage cells for multi-level memory cells could decrease the area required to store a set amount of information.

Accordingly, it is desirable to provide multi-level memory cells with reduced size, and methods for producing the same. In addition, it is desirable to provide non-volatile flash multi-level memory cells using thin film storage layers, where the memory cell is re-writable. It is also desirable to provide methods for producing such memory cells. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits with multi-level memory cells and methods for producing the same are provided. In an exemplary embodiment, a method for producing an integrated circuit with a multi-level memory cell includes forming a gate insulator overlying a substrate. A select gate is formed overlying the gate insulator such that one multi-level memory cell includes one select gate. A thin film storage layer with nanocrystals is formed overlying the select gate and the substrate, and a left and right control gate are formed on opposite sides of the select gate such that the thin film storage layer is between the substrate and each of the control gates. A left implant and a right implant are formed in the substrate such that the select gate, the left control gate, and the right control gate are positioned between the left and right implants.

In another embodiment, a method is provided for producing an integrated circuit with a multi-level memory cell bank with a plurality of multi-level memory cells. A plurality of select gates are formed overlying a substrate in a plurality of rows and a plurality of columns. A thin film storage layer with nanocrystals is formed overlying the substrate and the plurality of select gates. A left and right control gate are formed overlying the thin film storage layer on opposite sides of each select gate. A left and right implant are formed in the substrate on opposite sides of each left and right control gate such that each multi-level memory cell includes one select gate, one left control gate, and one right control gate positioned between one left implant and one right implant. A left control gate word line, a right control gate word line, and a select gate word line are formed in electrical connection with the left control gate, the right control gate, and the select gate, respectively, of each multi-level memory cell in one row. A left implant bit line and a right implant bit line are formed in electrical contact with the left implant and the right implant, respectively of each multi-level memory cell in one column.

An integrated circuit with a plurality of multi-level memory cell is provided in another embodiment. Each multi-level memory cell includes a substrate and a single select gate overlying the substrate. A left and right control gate overlie the substrate such that the select gate is positioned between the left and right control gate. A thin film storage layer including a plurality of nanocrystals is positioned between the left control gate and the substrate, and between the right control gate and the substrate. A left implant and a right implant are within the substrate and adjacent to the left and right control gate, respectively, such that the left control gate, the select gate, and the right control gate are positioned between the left and right implants.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

Multi-level memory cells and methods for producing the same according to various embodiments are provided herein. The multi-level memory cell has a left and right control gate formed as self aligned side wall spacers on opposite sides of a single select gate, where the left and right control gates and select gate overlie a substrate. A thin film storage layer is formed between the control gates and the substrate, where the thin film storage layer includes nanocrystals within an insulating material, and where the nanocrystals are capable of storing an electrical charge. A left and right implant are formed within the substrate such that the left control gate, the select gate, and the right control gate are positioned between the left and right implant. The left and right implants act as a source and a drain, and the implant acting as the source or drain switches when reading the multi-level memory cell to the left or to the right. A left control gate word line, a select gate word line, a right control gate word line, a left implant bit line, and a right implant bit line are all formed and used to operate the multi-level memory cell. The memory cell is read to the left to determine if there is a charge in the thin film storage layer between the left control gate and the substrate. When reading to the left, the left and right control gates and the select gate are charged, and the right implant is charged and serves as the drain while the left implant is grounded and acts as the source. If the current between the left and right implants is small, the thin film storage layer between the left control gate and the substrate is charged, and if the current is large, the thin film storage layer is not charged. To read the thin film storage layer between the right control gate and the substrate, the charges on the left and right implant are reversed, and the process is repeated.

Figure 1:
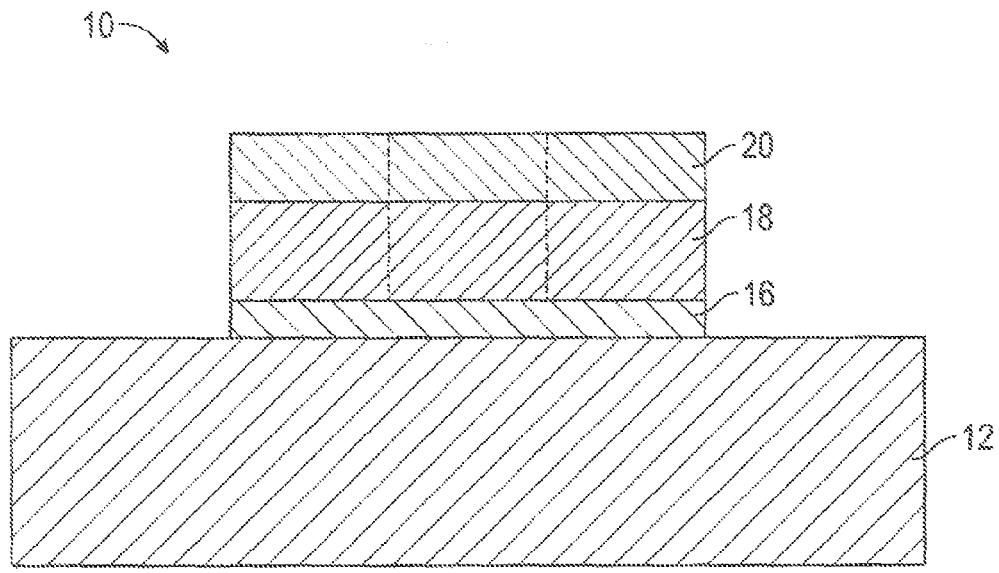
FIGS. 1-7 illustrate, in cross sectional views, a multi-level memory cell and methods for fabrication the same in accordance with exemplary embodiments.

Reference is now made to the exemplary embodiment illustrated in FIG. 1. The method of producing a multi-level memory cell 10 includes providing a semiconductor substrate 12. As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor material is preferably a silicon substrate. The silicon substrate may be a bulk silicon wafer (as illustrated) or may be a thin layer of silicon on an insulating layer (commonly known as silicon-on-insulator or SOI) that, in turn, is supported by a carrier wafer. Following standard semiconductor techniques, isolations are formed between transistors, such as shallow trench isolations (not shown), and the substrate is cleaned as needed.

A gate dielectric layer is formed overlying the substrate, for example by thermally oxidizing a top surface of the substrate 12 to produce silicon oxide. As used herein, "overlying" means "on" such that the gate dielectric layer physically contacts the substrate 12, or "over" such that another material layer, such as an interfacial layer, may lie in between the gate dielectric layer and the substrate 12. The top surface of the substrate 12 is oxidized by exposing it to an oxidizing ambient, such as oxygen or steam, at a temperature of about 900 degrees centigrade (° C.) to about 1,100° C. Alternatively, the gate dielectric layer 16 could be other insulating materials, such as silicon nitride, silicon oxynitride or the like, or a high dielectric constant insulator ("high-k dielectric") deposited by chemical vapor deposition, atomic layer deposition, or other methods.

After the gate dielectric layer is formed, a select gate material layer is formed overlying the gate dielectric layer. In an exemplary embodiment, the select gate material layer is formed by depositing polycrystalline silicon (hereinafter "polysilicon") overlying the gate dielectric layer, then depositing a hard mask layer overlying the polysilicon. The polysilicon can be deposited by low pressure chemical vapor deposition in a silane environment, and the hard mask layer can be silicon nitride, for example, which is deposited by low pressure chemical vapor deposition with ammonia and dichlorosilane. A layer of photoresist (not shown) is then deposited overlying the hard mask layer, such as by spin coating, and the photoresist is patterned with a mask and electromagnetic radiation (light). In an exemplary embodiment, deep ultraviolet (DUV) electromagnetic radiation is provided by a KrF laser at about a 248 nanometer wavelength, or by an ArF laser at about a 193 nanometer wavelength. The patterned photoresist is developed, such as with a solvent, to expose the hard mask layer except for portions that will overlie a select gate 18. Portions of the exposed hard mask layer, the underlying polysilicon, and the underlying gate dielectric layer are then removed to leave the select gate 18, a portion of the hard mask 20 directly overlying the select gate 18, and a gate dielectric 16. The exposed hard mask 20 can be etched with a plasma reactive ion etch using, for example, hydrogen and nitrogen trifluoride, and the exposed polysilicon can be etched with difluoromethane and sulfur hexafluoride. The gate dielectric layer can be etched with a reactive ion etch using carbon tetrafluoride in a hydrogen plasma. Other well known etching processes can also be used as appropriate, and as known by those skilled in the art. The photoresist is removed, such as with an oxygen containing plasma, after portions of the hard mask 20 and the polysilicon are removed. An antireflective coating (not illustrated) can optionally be formed overlying the polysilicon of the select gate 18 to improve the photoresist patterning accuracy.

Figure 2:
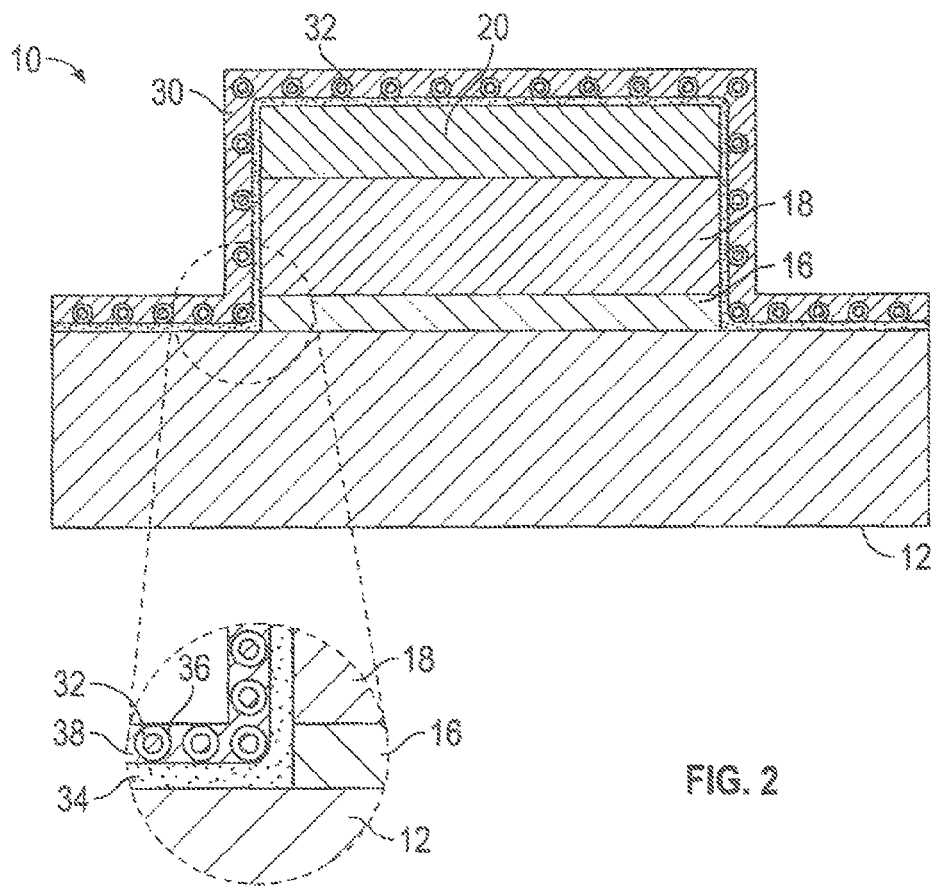

Referring now to FIG. 2, a thin film storage layer 30 is formed overlying the substrate 12, the hard mask 20, and the vertical side portions of the select gate 18 and the gate dielectric 16. The thin film storage layer 30 has several different components, described below, including isolated silicon nanocrystals 32 that serve as storage nodes for electrical charges in the multi-level memory cell 10.

Several known methods can be used to form the thin film storage layer 30, and alternate methods can be used in different embodiments. In an exemplary embodiment, a bottom dielectric layer 34 of oxynitride is uniformly deposited overlying the multi-level memory cell 10, including the substrate 12, the select gate 18, the gate dielectric 16, and the remaining hard mask 20, such as by plasma enhanced chemical vapor deposition using nitrous oxide and silane. The nanocrystals 32 are then formed on the bottom dielectric layer 34. Amorphous silicon is deposited on the bottom dielectric layer 34, such as by chemical vapor deposition, plasma enhanced chemical vapor deposition, or sputtering. In one exemplary embodiment, the amorphous silicon is deposited by chemical vapor deposition at about 300° C. to about 550° C. for about 10 to about 150 seconds in an ambient of nitrogen and disilane at a ratio of disilane to nitrogen of about 11/5,000. The amorphous silicon is then annealed, such as by heating to about 600° C. to about 1,050° C. for about 1 to about 60 seconds in a nitrogen ambient, and the amorphous silicon agglomerates into a plurality of nanocrystals 32 when annealed. A second anneal, such as from about 300° C. to about 1,050° C. for about 1 to about 60 seconds in an oxygen ambient, is then performed to reduce the number of small nanocrystals 32, because some of the smaller nanocrystals 32 will either fully oxidize or be absorbed by another nanocrystal 32 to increase in size. Silicon is then deposited overlying the nanocrystals 32 and the bottom dielectric layer 34. In an exemplary embodiment, the silicon is deposited by chemical vapor deposition at about 300° C. to about 550° C. for about 10 to about 150 seconds in an ambient of nitrogen and disilane with a concentration ratio of disilane to nitrogen of about 11/5,000. Another anneal is performed to ensure the existing nanocrystals 32 absorb the silicon just deposited. In an embodiment, the anneal is performed by heating from about 600° C. to about 1,050° C. for about 1 to about 60 seconds in a nitrogen ambient. This is followed by another anneal to grow a nanocrystal dielectric surface layer 36 of silicon oxide around the nanocrystals 32, such as by heating from about 300° C. to about 1,050° C. for about 1 to 60 seconds in an oxygen ambient. The resulting nanocrystals 32 are about 0.1 to about 50 nanometers in diameter in an exemplary embodiment, and are encased in the nanocrystal dielectric surface layer 36.

A top dielectric layer 38 is then deposited overlying the bottom dielectric layer 34 and the nanocrystals 32. A wide variety of dielectric materials can be used in the top dielectric layer 38, including but not limited to silicon oxide, silicon nitride, or other insulating materials such as high dielectric constant materials (high K materials). In an exemplary embodiment, a top dielectric layer 38 of silicon oxide is deposited by chemical vapor deposition using silane in an oxygen ambient. The top dielectric layer 38 overlies the nanocrystals 32, but also fills the space between adjacent nanocrystals 32 such that the nanocrystals 32 are encased in dielectric material by the nanocrystal dielectric surface layer 36, the top dielectric layer 38, and the bottom dielectric layer 34. Therefore, the nanocrystals 32 save and store an electric charge until a sufficient electric voltage causes the charge to tunnel across the surrounding dielectrics. In the same manner, a sufficient electric voltage is needed to charge the nanocrystals 32 from an uncharged state. Other known methods can also be used to form the thin film storage layer 30 in alternate embodiments.

Figure 3:
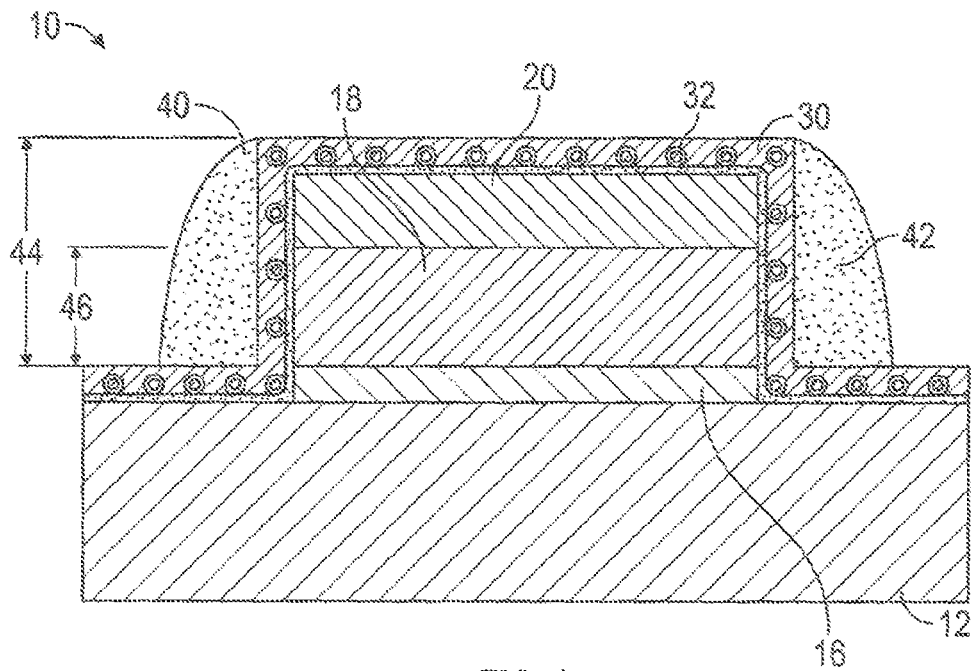

Reference is now made to FIG. 3. A left control gate 40 and a right control gate 42 are formed on opposite sides of the select gate 18, with the thin film storage layer 30 positioned between the select gate 18 and the left and right control gates 40, 42. The terms "left" and "right" are used herein to denote two different components, but are not used to indicate the position of those components. Therefore, the left and right control gates 40, 42 are not one single component, but are two separate components, and the left control gate 40 is not necessarily to the left of the right control gate 42. The terms "left" and "right" are used in a similar manner for other components below, where "left" and "right" do not indicate the position of one component relative to another. In an exemplary embodiment, the left and right control gates 40, 42 are formed as self aligned spacers on opposite sides of the select gate 18, so the left and right control gates 40, 42 have an approximately triangular shape. The approximately triangular shape of the left and right control gates 40, 42 is not necessarily a perfect triangle, and in many embodiments the hypotenuse tends to have a bowed or bent shape, as illustrated, but the left and right control gates 40, 42 still have a generally triangular shape with 3 distinct sides. The spacer form of the left and right control gates 40, 42 facilitates manufacture of the multilevel memory cell 10 in a small space, because the left and right control gates 40, 42 do not extend very far beyond the select gate 18. The self-aligned spacer form also reduces the number of lithographic masks over a more conventional polysilicon deposition, lithographic patterning, and etch technique, but the more conventional form of the left and right control gates 40, 42 can be used in some embodiments. The thin film storage layer 30 serves as a dielectric to electrically separate the select gate 18 from the left and right control gates 40, 42. In an exemplary embodiment, the left and right control gates 40, 42 are formed by depositing polysilicon overlying the thin film storage layer 30, and then anisotropically etching the polysilicon with a reactive ion etch using sulfur hexafluoride. The anisotropic etch is stopped before etching the substrate 12 and the thin film storage layer 30 beyond the select gate 18 and the left and right control gates 40, 42. In an alternate embodiment (not shown), the thin film storage layer 30 is removed overlying the substrate 12 beyond the left and right control gates 40, 42.

The left and right control gates 40, 42 extend to a control gate height, indicated by a double headed arrow 44, that is greater than a select gate height, indicated by a double headed arrow 46, because the left and right control gates 40, 42 extend to about the level of the hard mask 20 overlying the select gate 18. The thin film storage layer 30 may or may not be present overlying the hard mask 20 in various embodiments, but the thin film storage layer 30 is relatively thin compared to the hard mask 20 and the select gate 18 so it has little impact on the control gate height 44. The control gate height 44 is the distance relative to a top surface of the thin film storage layer 30 underlying the left and/or right control gate 40, 42 to the highest point of the approximately triangular left and/or right control gates 40, 42. The select gate height 46 is the distance relative to a top surface of the thin film storage layer 30 underlying the left and/or right control gate 40, 42 to the interface between the hard mask 20 and the select gate 18.

Figure 4:
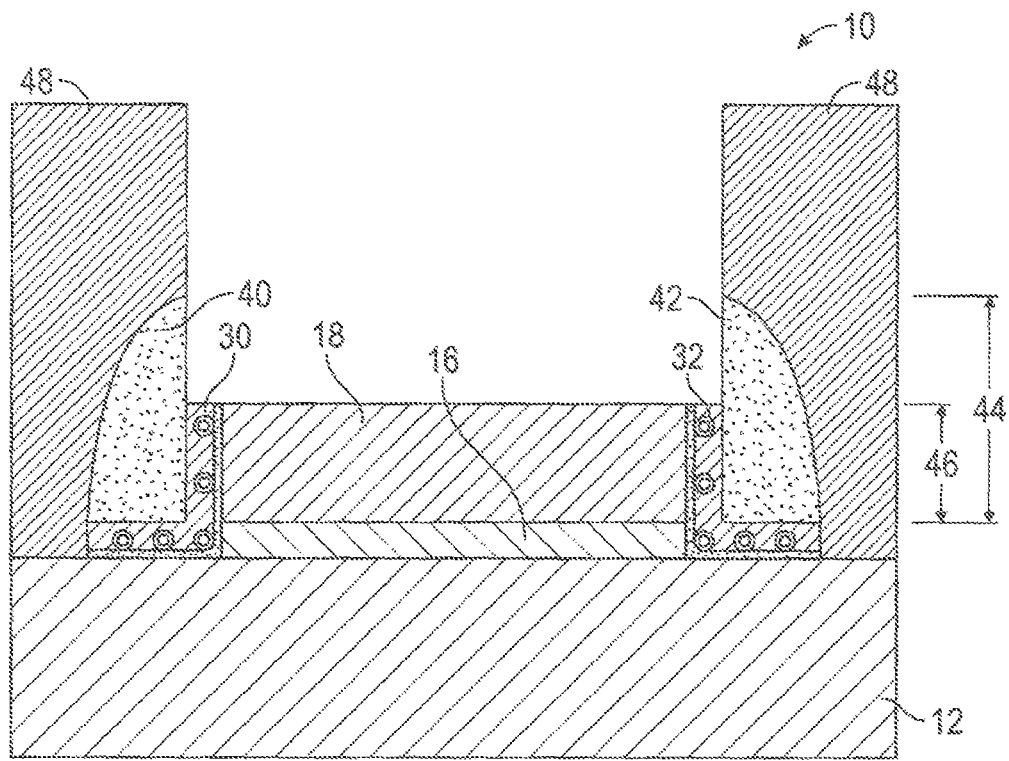
Figure 5:
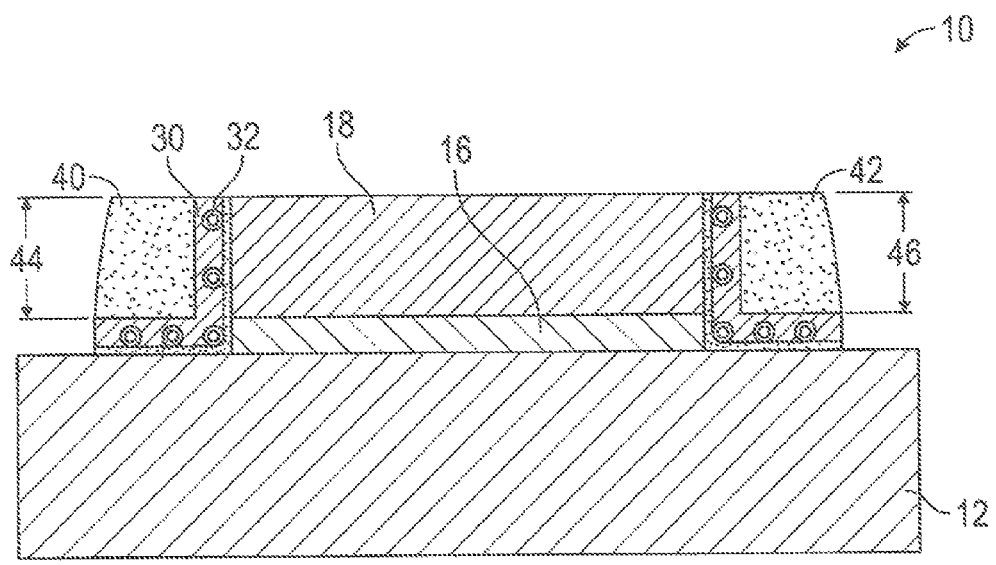

Referring now to the exemplary embodiment illustrated in FIG. 4 with continuing reference to FIG. 3, a hard mask photoresist 48 is formed overlying the select gate 18 and hard mask 20, the left and right control gates 40, 42, and the substrate 12. The hard mask photoresist 48 is then patterned and developed to expose the thin film storage layer 30 overlying the hard mask 20 and the select gate 18. The hard mask photoresist 48 can be deposited by spin coating, patterned by exposing selected areas to light, and developed with an organic solvent to remove the desired areas with an organic solvent. The hard mask photoresist 48 remains to mask logic areas, high voltage areas, and other electronic components (not shown) used in the integrated circuit with the multi-level memory cell 10. The thin film storage layer 30 is removed, such as by a wet etch with dilute hydrofluoric acid, and the hard mask 20 is removed, such as with a reactive ion etch using carbon tetrafluoride, difluoromethane, and oxygen. The upper surface of the select gate 18 thus is left exposed. The hard mask photoresist 48 is then removed, such as with an oxygen containing plasma. In some embodiments, the left and right control gates 40, 42 are leveled by chemical mechanical planarization to a point where the control gate height 44 is essentially the same as the select gate height 46, as illustrated in FIG. 5, with continuing reference to FIG. 4. The left and right control gates 40, 42 can be leveled after the hard mask photoresist 48 is removed, or at several other points in the process. Leveling the left and right control gates 40, 42 can aid in aligning contacts with the left and right control gates 40, 42, but also increases manufacturing costs by adding a leveling step to the manufacturing process.

Figure 6:
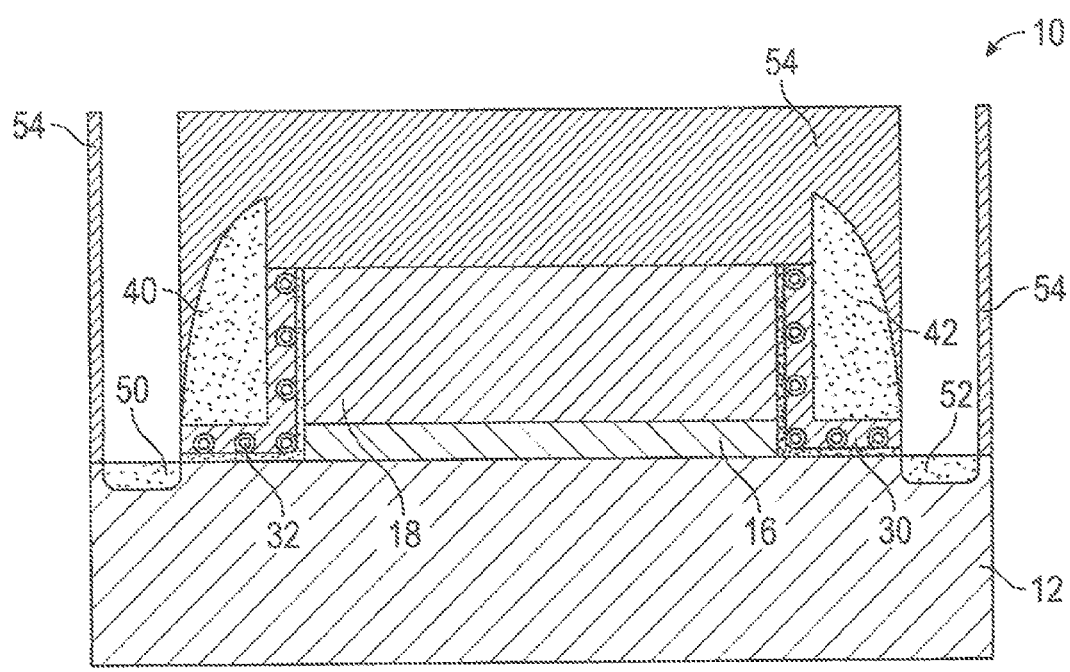

An implant photoresist 54 is formed overlying the multi-level memory cell 10 and is patterned and developed to expose selected portions of the substrate for a left and right implant 50, 52, as illustrated in FIG. 6. The implant photoresist 54 also masks logic areas, high voltage areas, and other electronic components (not shown) used in the integrated circuit. A left implant 50 and a right implant 52 are formed in the substrate 12 adjacent to the left and right control gates 40, 42, respectively, such that the left and right control gates 40, 42 and the select gate 18 are positioned between the left and right implants 50, 52. The left and right implants 50 are formed by implanting conductivity-determining ions into the substrate 12. The ions are either "N" type, such as phosphorus or arsenic, or "P" type, such as boron or boron difluoride depending on the type of multi-level memory cell 10 desired, but other types of ions can also be used. Defects from the implanting process are corrected by a post-implant annealing step at about 900 degrees centigrade (° C.).

Figure 7:
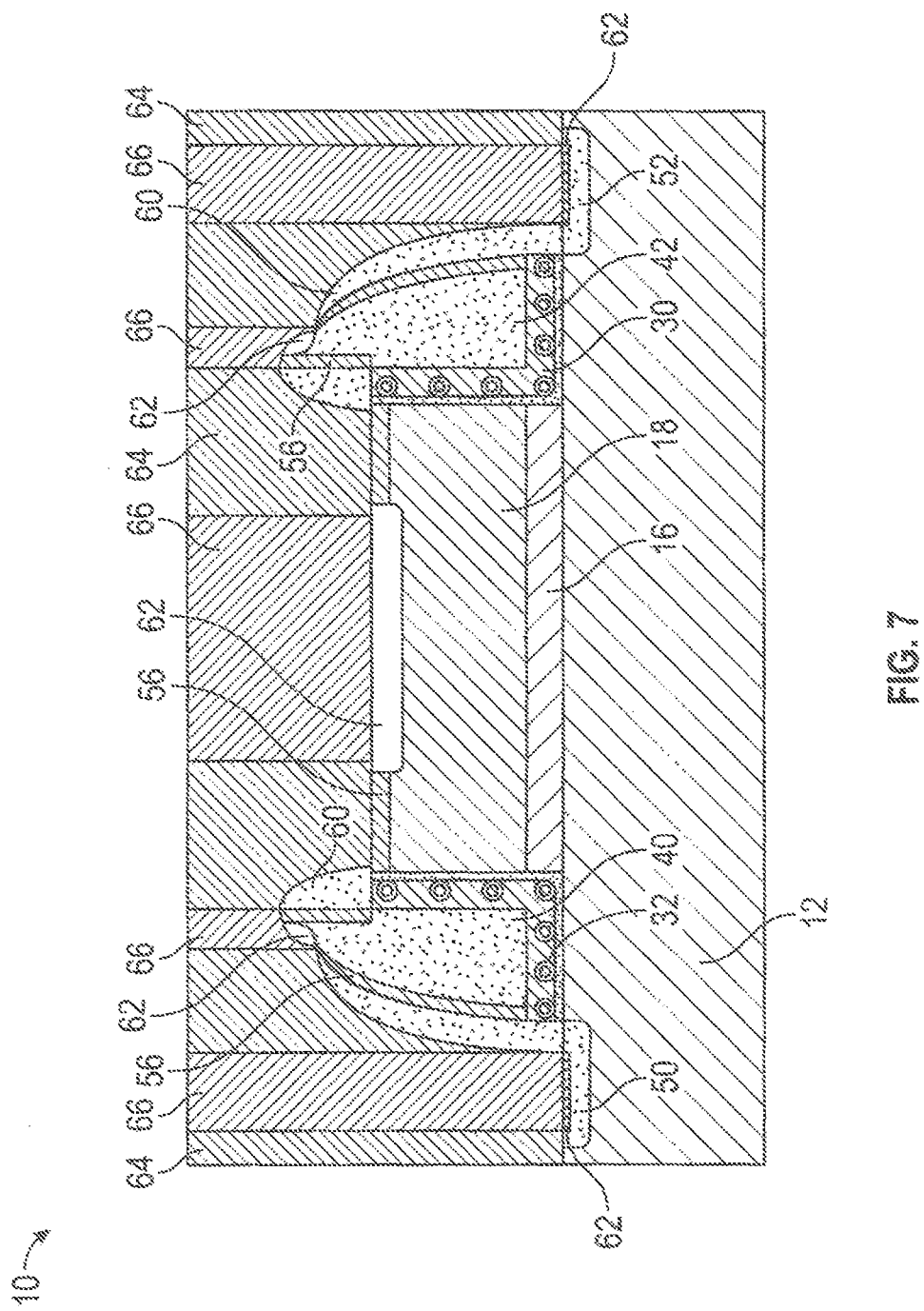

Referring now to FIG. 7, with continuing reference to FIG. 6, the implant photoresist 54 is removed, such as with an oxygen containing plasma. A surface dielectric 56 is formed on the exposed surfaces of the left and right control gates 40, 42 and the select gate 18. In one embodiment, the surface dielectric 56 is silicon oxide that is formed by oxidizing the exposed polysilicon on the left and right control gates 40, 42 and the select gates 18, such as by exposure to an oxidizing ambient at elevated temperatures. The surface dielectric 56 insulates the left and right control gates 40, 42 and the select gate 18 to aid in the function of the multi-level memory cell 10. Logic gate spacers 60 are formed along the side surfaces of the left and right control gates 40, 42 following a logic and high voltage lightly doped drain implant over the masked logic areas, high voltage areas, and other electronic components (all not shown) used in the integrated circuit. The logic gate spacers 60 further insulate the left and right control gates 40, 42, and aid in proper positioning of electrical contacts (described below.) The logic gate spacers 60 may be formed by depositing a composite silicon oxide and silicon nitride layer (which assumes an "L" shape adjacent to the vertical left and right control gates 40, 42) over the exposed surfaces of the multi-level memory cell 10, and subsequent anisotropic etching. In an exemplary embodiment, the silicon nitride layer is deposited by low pressure chemical vapor deposition using ammonia and dichlorosilane, the silicon oxide layer is deposited by chemical vapor deposition with tetraethylorthosilicate (TEOS), and the composite layer is then anisotropically etched by reactive ion etching with carbon tetrafluoride, difluoromethane, and oxygen. The anisotropic etch leaves some of the silicon nitride/silicon oxide composite layer along the vertical or near-vertical surfaces of the left and right control gates 40, 42 to form the logic gate spacers 60. The etch is allowed to remove the composite silicon oxide and silicon nitride layer from the top surface of the left and right control gates 40, 42, which are more horizontal than other portions of the left and right control gates 40, 42.

The vertical or near-vertical logic gate spacers 60 form a natural insulator between the left and right control gates 40, 42 and the select gate 18, respectively. This aids in the formation of the silicided contact points 62 on the left and right control gates 40, 42 and the select gate 18 without forming an electrical short between the select gate 18 and either the left or right control gate 40, 42. The contact areas 62 are then silicided to improve electrical connectivity. The contact areas 62 include upper surfaces of the left and right control gates 40, 42; the select gate 18; and the left and right implants 50, 52. Any remaining dielectric over the contact areas 62 is removed, for example by a reactive ion etch with hydrofluoric acid. Metal is then deposited overlying the contact areas 62, such as by depositing nickel using chemical vapor deposition, and the deposited metal reacts with the silicon at the contact areas 62 upon annealing to form a silicide. The silicide at the contact areas 62 aids in electrically connecting the various components of the multi-level memory cell 10 to other electronic components. An interlayer dielectric 64 is formed overlying the multi-level memory cell 10, such as by depositing silicon oxide by chemical vapor deposition using silane and oxygen, but other insulating materials can also be used. Vias (not shown) are formed through the interlayer dielectric 64 to the contact areas 62. Contacts 66 are formed within the vias to electrically connect the contact areas 62, and the associated portions of the multi-level memory cell 10, with other electronic components in an integrated circuit. The contacts 66 are formed using standard techniques well known to those skilled in the art, such as forming a titanium/titanium nitride (Ti/TiN) barrier layer by physical vapor deposition, followed by depositing a tungsten (W) plug to form the contact.

Figure 8:
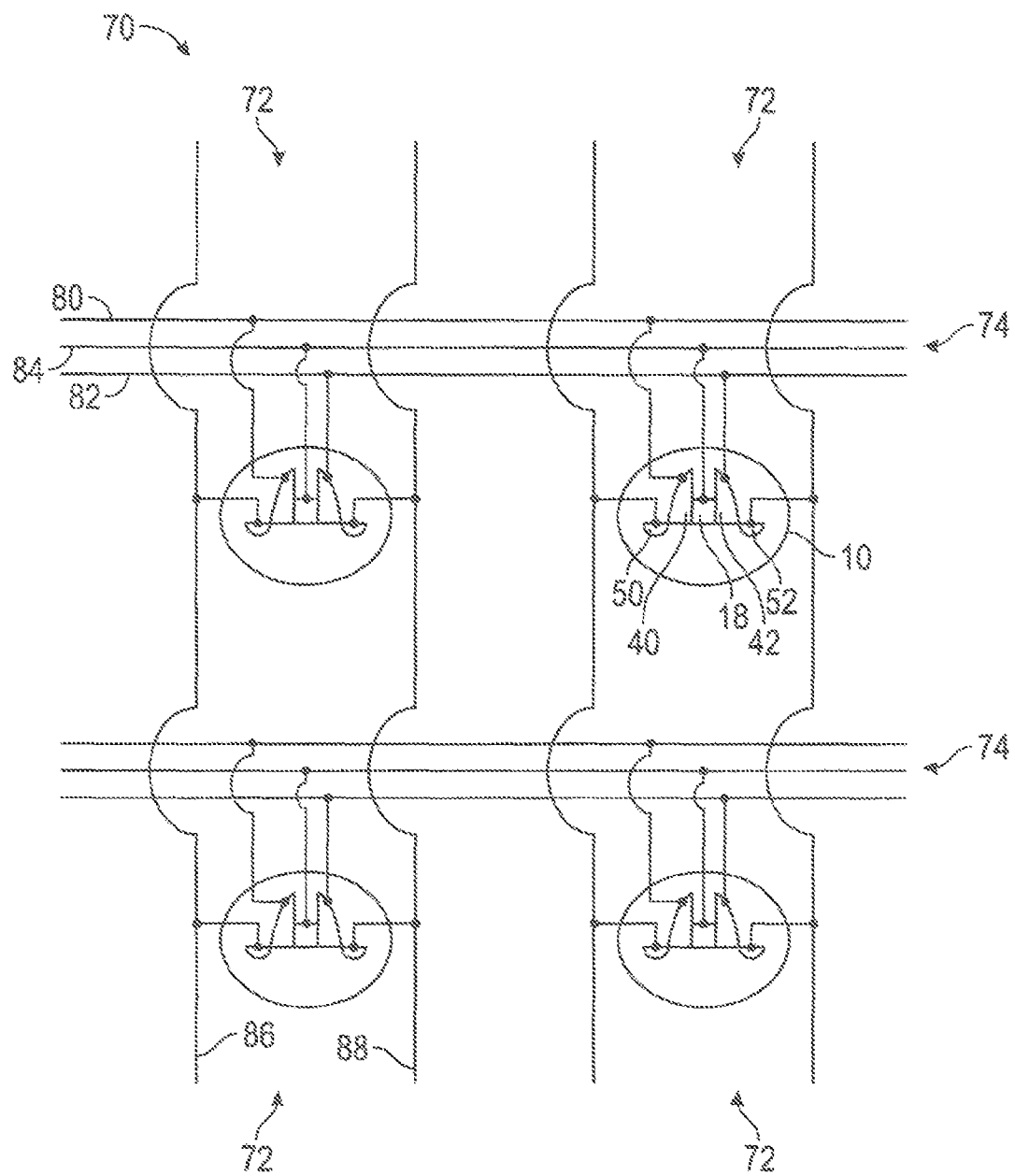
FIG. 8 is a schematic drawing of an exemplary multi-level memory cell bank with a plurality of multi-level memory cells.

In an exemplary embodiment, the multi-level memory cell 10 is incorporated into a multi-level memory cell bank 70 including a plurality of multi-level memory cells 10 positioned in a plurality of rows 72 and columns 74, as illustrated in FIG. 8, with continuing reference to FIG. 7. Each multi-level memory cell 10 is formed in essentially the same manner as described above. Bit lines and word lines are formed using standard techniques well known to those skilled in the art, and electrically connected to the contacts 66 as further described below. In an exemplary embodiment, the bit lines and word lines are formed from copper, which can be deposited using a damascene process by forming a trench, depositing copper by electroless or electrolytic plating from a solution such as a sulfuric acid copper bath, and subsequent chemical mechanical planarization to remove the copper except for within the trenches. There are three word lines for one column 74 of multi-level memory cells 10, including: a left control gate word line 80 electrically connected to the left control gate 40 of each multi-level memory cell 10 in the one column 74; a right control gate word line 82 electrically connected to each right control gate 42 in the one column 74; and a select gate word line 84 electrically connected to each select gate 18 in the one column 74. There are two bit lines for each row 72 including: a left implant bit line 86 electrically connected to the left implant 50 of each multi-level memory cell 10 in the one row 72; and a right implant bit line 88 electrically connected to each right implant 52 in the one row 72.

The integrated circuit includes many other electronic components (not illustrated) that are used to operate the multi-level memory cell bank 70, such as sense amplifiers, high and medium voltage supply sources for the word line and bit line decoders, drivers, etc. These electronic components are manufactured and connected to the multi-level memory cell bank 70 using known methods and techniques. The multi-level memory cell bank 70 is operated by manipulating the voltage to the various word lines 80, 82, 84, and bit lines 86, 88, and by reading the voltage or current resulting from the manipulations. The following description is for "N" type multi-level memory cells 10, but "P" type multi-level memory cells can also be used with reversed polarities. The following table illustrates an exemplary embodiment for the voltages used for various actions for an individual multi-level memory cell 10 as illustrated in FIG. 8. Reading or writing to the left indicates actions related to the thin film storage layer 30 underlying the left control gate 40, and reading or writing to the right indicates actions related to the thin film storage layer 30 underlying the right control gate 42.

Voltages for Operation

|  | Read (left) | Read (right) | Write (left) | Write (right) | Erase |
|---|---|---|---|---|---|
| CGL (40) | 1.5 | 1.5 | 9 | 0.8 to 1.2 | 13 to 14 |
| CGR (42) | 1.5 | 1.5 | 0.8 to 1.2 | 9 | 13 to 14 |
| SG (18) | 1.2 | 1.2 | 0.8 | 0.8 | 0 |
| LI (50) | 0 | 0.5 | 5 | 0 | 0 |
| RI (52) | 0.5 | 0 | 0 | 5 | 0 |

CGL—Left control gate (40);
CGR—Right control gate (42);
SG—Select gate (18);
LI—Left implant (50);
RI—Right implant (52)

Writing to the left means depositing an electrical charge on the nanocrystals 32 in the thin film storage layer 30 underlying the left control gate 40. A portion of the thin film storage layer 30 is between the left control gate 40 and the select gate 18, but this portion serves a much smaller charge storing function than the thin film storage layer 30 underlying the left (or right) control gate 40. This is accomplished by applying a voltage of about 9 volts to the left control gate 40 while applying a voltage of about 5 volts to the left implant 50. The select gate 18 and the right control gate 42 are electrically "on," with a small voltage or bias on the select gate 18 and the right control gate 42. The right implant 52 is grounded, and a channel area of the substrate 12 under the select gate 18 and the right control gate 42 is also electrically "on," due to the small charge on the select gate and the right control gate 42, so electrons can travel through the channel area of the substrate 12. Electrons and holes are generated in the right implant 52, which acts as a drain, and the electrons move through the channel area of the substrate 12 towards the voltage of the left implant 50, which is acting as a source. The holes travel in the direction of the right implant 52, while a few holes may travel to the grounded well, or are lost in the form of leakage. The thin film storage layer 30 is programmed by a process called source side injection. The electrons travelling through the channel area of the substrate 12 toward the source (left implant 50) are injected onto the nanocrystals 32 across the insulating layers of the thin film storage layer 30 at the gap region between the select gate 18 and the left control gate 40 by momentum transfer. The voltage of about 9 volts on the left control gate 40 provides enough energy (about 3.2 electron volts) for the electrons to inject across the insulating layers of the thin film storage layer 30 and onto the nanocrystals 32. When the write voltages are terminated, the electrons on the nanocrystals 32 no longer have a sufficient voltage to tunnel through the insulating layers around the nanocrystals 32, so the nanocrystals 32 maintain a charge. The multi-level memory cell 10 is non-volatile, because the nanocrystals 32 maintain a charge even when the multi-level memory cell 10 is de-powered. Similar operations are used to write to the right, except the right implant 52 and right control gate 42 are charged while the left implant 50 is grounded and the left control gate 40 has a low voltage.

The ability to provide flexibility to write one bit per each write operation while not writing to unselected cells is desirable. Accidental or unintended writing can occur in some integrated circuits, referred to as write disturbs. In this exemplary embodiment with the bias voltages range listed above, all unselected cells that shared the same left implant 50 with the cell being written to apply a voltage of 0 to the unselected left and right control gates 40, 42. Likewise, all unselected cells that shared the same left control gate 40 with the cell being written to apply about a 1.2 volt bias to the drain (which is the right implant 52 in the embodiment described), to inhibit or reduce the hot electron effect and thereby reduce or eliminate any unintended writing to unselected cells.

Flash memory erase operations are typically done in block, sector, or chip modes for fast erase operations, so both the thin film storage layer 30 is erased under both the left and right control gates 40, 42 at the same time. The erase operation can be done with very little active current, such as a total current in nano amp range due to the nature of the tunneling process. For a block erase process, where all the memory cells on the same column 74 are erased, a voltage range of about 13 to about 14 volts is applied to both the left and right control gates 40, 42 while the left and right implants 50, 52 are grounded. This erases the stored information by providing sufficient charge for the electrons on the nanocrystals 32 to tunnel through the insulating layers and discharge from the nanocrystals 32 onto the left and right control gates 40, 42, respectively. For a sector erase, which contains multiple blocks, all left and right control gates 40, 42 sharing the same blocks are on high voltage (about 13 to about 14 volts), while the rest unselected sectors are on low.

The multi-level memory cell 10 is read to the left by applying a voltage of about 1.5 volts to each of the left and right control gates 40, 42, and a voltage of about 1.2 volts to the select gate 18. The left implant 50 is grounded, so it serves as a source, and the right implant is charged to about 0.5 volts, so it serves as a drain. If there is a charge stored on the nanocrystals 32 underlying the left control gate 40, the threshold voltage is increased and very little current flows between the left and right implants 50, 52. For example, a current of less than about one nano amp indicates a charge is stored on the nanocrystals 32. This is read as a "0". If there is no charge stored on the nanocrystals 32 underlying the left control gate 40, the threshold voltage is lower and much more current flows between the left and right implants 50, 52. For example, a current of about one micro amp or more indicates no charge is stored on the nanocrystals 32. This is read as "1". Sense amplifiers (not shown) determine the amount of current, and therefore determine if a "0" or a "1" is read. The multi-level memory cell 10 is separately read to the left and to the right to determine the information stored. If no charges are stored on the nanocrystals 32 under either of the left or right control gates 40, 42, the multi-level memory cell 10 is read as a "11", and if a charge is stored on the nanocrystals 32 underlying each of the left and right control gates 40, 42 the multi-level memory cell 10 is read as a "00". If a charge is stored on the nanocrystals 32 underlying only the left control gates 40 and not the right control gate 42, or if a charge is stored only under the right control gate 42 and not the left control gate 40 the multi-level memory cell 10 is read as a "10" or as a "01", and the manner of reading can vary depending on the designer convention.

Similar to the unintended write operation or disturb described above, some integrated circuits have an unintended read disturb. Certain voltages are used to prevent the unintended read disturb, or the reading of unselected cells. For example, all unselected cells that either share the selected left or right implant 50, 52 with the selected cell can apply a voltage of 0 to the associated left and right control gates 40, 42 and the select gate 18. Additionally, all unselected cells that shared the same left and right control gates 40, 42 and select gate 18, or all unselected cells in the same column 74, apply an inhibitory voltage of about 0.5 volts to the left and right implants 50, 52 to suppress the disturb.

Each individual multi-level memory cell 10 is located at the intersection of one column 74 and one row 72 in the multi-level memory cell bank 70, so the number of the column 74 and the row 72 serves as the address for that multi-level memory cell 10. A desired multi-level memory cell 10 is selected by activating the bit and word lines for the selected multi-level memory cell 10. In this manner, information is stored and read from a multi-level memory cell bank 70.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit with a multi-level memory cell comprising:
    forming a gate insulator overlying a substrate;
    forming a select gate overlying the gate insulator such that one multi-level memory cell includes one select gate;
    forming a thin film storage layer overlying the select gate and the substrate, wherein the thin film storage layer comprises a plurality of nanocrystals;
    forming a left control gate and a right control gate on opposite sides of the select gate and overlying the thin film storage layer such that the thin film storage layer is between the left control gate and the substrate, and the thin film storage layer is between the right control gate and the substrate;
    forming a select gate hard mask overlying the select gate prior to forming the left control gate and the right control gate;
    removing the select gate hard mask after forming the left control gate and the right control gate such that the left control gate and the right control gate extend above the select gate; and
    forming a left implant and a right implant in the substrate such that the select gate, the left control gate, and the right control gate are positioned between the left implant and the right implant.

2. The method of claim 1 further comprising:
    forming a left implant bit line electrically connected to the left implant and a right implant bit line electrically connected to the right implant.

3. The method of claim 1 further comprising:
    forming a left control gate word line electrically connected to the left control gate;
    forming a select gate word line electrically connected to the select gate; and
    forming a right control gate word line electrically connected to the right control gate.

4. The method of claim 1 wherein forming the left control gate and the right control gate further comprises forming the left control gate and the right control gate with an approximately triangular shape.

5. The method of claim 4 wherein forming the left control gate and the right control gate further comprises:
    depositing polysilicon overlying the select gate and the substrate; and
    anisotropically etching the polysilicon.

6. The method of claim 1 further comprising:
    leveling the left control gate and the right control gate by chemical mechanical planarization such that a control gate height is about the same as a select gate height.

7. The method of claim 1 further comprising:
    forming a multi-level memory cell bank by forming a plurality of multi-level memory cells in a plurality of rows and columns.

8. The method of claim 1 further comprising:
    forming an interlayer dielectric overlying the select gate, the left control gate, the right control gate, the left implant, and the right implant; and
    forming a plurality of contacts through the interlayer dielectric, wherein the plurality of contacts comprises individual contacts electrically connected to each of the select gate, the left control gate, the right control gate, the left implant, and the right implant.

9. The method of claim 1 wherein forming the thin film storage layer further comprises:
    forming a bottom dielectric layer;
    forming the plurality of nanocrystals overlying the bottom dielectric layer; and
    forming a top dielectric layer overlying the plurality of nanocrystals.

10. The method of claim 1 further comprising:
    forming logic gate spacers adjacent to the left control gate and the right control gate.

11. A method of forming an integrated circuit with a multi-level memory cell bank comprising a plurality of multi-level memory cells, the method comprising:
    forming a plurality of select gates overlying a substrate in a plurality of rows and a plurality of columns;
    forming a select gate hard mask overlying each select gate;
    forming a thin film storage layer overlying the substrate and the plurality of select gates, wherein the thin film storage layer comprises a plurality of nanocrystals;
    forming a left control gate and a right control gate overlying the thin film storage layer and on opposite sides of each select gate, wherein the left control gate and the right control gate are self aligned with the select gate, and wherein the left control gate and the right control gate have an approximately triangular shape that extends above the select gate to the select gate hard mask;
    removing the select gate hard mask such that a control gate height is larger than a select gate height
    forming a left implant and a right implant in the substrate on opposite sides of each left control gate and right control gate, wherein one multi-level memory cell comprises one select gate, one left control gate, one right control gate, one left implant and one right implant, and wherein the select gate, left control gate, and right control gate are between the left implant and the right implant;
    forming a left control gate word line, a right control gate word line, and a select gate word line, wherein the left control gate word line, the right control gate word line, and the select gate word line are electrically connected to the left control gate, the right control gate, and the select gate, respectively, of each multi-level memory cell in one column; and
    forming a left implant bit line and a right implant bit line, wherein the left implant bit line and the right implant bit line are electrically connect to the left implant and the right implant, respectively, of each multi-level memory cell in one row.

12. The method of claim 11 wherein forming the left control gate and the right control gate further comprises:
   depositing polysilicon overlying the select gate and the substrate; and
   anisotropically etching the polysilicon.

13. The method of claim 11 wherein forming the thin film storage layer further comprises:
   forming a bottom dielectric layer;
   forming the plurality of nanocrystals overlying the bottom dielectric layer; and
   forming a top dielectric layer overlying the plurality of nanocrystals.

14. The method of claim 11 further comprising:
   forming a gate insulator overlying the substrate prior to forming the plurality of select gates such that the gate insulator is positioned between the substrate and each select gate.

15. The method of claim 11 further comprising:
   leveling the left control gate and the right control gate with the select gate by chemical mechanical planarization such that the control gate height is about the same as the select gate height.

16. The method of claim 11 further comprising:
   removing the thin film storage layer from over the plurality of select gates prior to electrically connecting the select gate word line with the select gates.

17. The method of claim 11 further comprising:
   forming logic gate spacers adjacent to the left control gate and the right control gate.

* * * * *